(12) United States Patent
Magendanz et al.

(10) Patent No.: US 8,240,203 B2
(45) Date of Patent: Aug. 14, 2012

(54) MEMS DEVICES AND METHODS WITH CONTROLLED DIE BONDING AREAS

(75) Inventors: Galen Magendanz, Issaquah, WA (US); Mark Eskridge, Renton, WA (US); Matt Loesch, Snohomish, WA (US)

(73) Assignee: Honeywell International Inc., Morristown, NJ (US)

( * ) Notice: Subject to any disclaimer, the term of this patent is extended or adjusted under 35 U.S.C. 154(b) by 805 days.

(21) Appl. No.: 12/333,200

(22) Filed: Dec. 11, 2008

(65) Prior Publication Data

US 2010/0147075 A1 Jun. 17, 2010

(51) Int. Cl.
*G01P 15/14* (2006.01)

(52) U.S. Cl. ............... 73/504.01; 73/514.18; 73/514.15

(58) Field of Classification Search ............... 73/514.01, 73/514.02, 514.15, 514.18
See application file for complete search history.

(56) References Cited

U.S. PATENT DOCUMENTS

| | | | |
|---|---|---|---|
| 6,078,016 A * | 6/2000 | Yoshikawa et al. ............ 200/181 |
| 6,301,966 B1 * | 10/2001 | Foote ........................ 73/514.33 |
| 6,442,307 B1 | 8/2002 | Carr et al. |
| 6,718,605 B2 * | 4/2004 | Yazdi et al. .................. 29/25.42 |
| 6,761,070 B2 * | 7/2004 | Zarabadi et al. ........... 73/514.32 |
| 6,927,098 B2 * | 8/2005 | DCamp et al. ................ 438/121 |
| 7,299,696 B2 * | 11/2007 | Saeki .......................... 73/514.33 |
| 7,334,476 B2 * | 2/2008 | Ichikawa ................... 73/514.33 |
| 7,416,910 B2 * | 8/2008 | Foote et al. .................... 438/48 |
| 2003/0071283 A1 * | 4/2003 | Heschel ...................... 257/200 |
| 2004/0259325 A1 * | 12/2004 | Gan ............................. 438/456 |
| 2005/0205951 A1 * | 9/2005 | Eskridge ..................... 257/416 |
| 2006/0081047 A1 * | 4/2006 | Saeki ......................... 73/514.16 |
| 2006/0128048 A1 * | 6/2006 | Foote et al. .................... 438/50 |
| 2010/0084752 A1 * | 4/2010 | Horning et al. .............. 257/682 |

* cited by examiner

*Primary Examiner* — Freddie Kirkland, III

(74) *Attorney, Agent, or Firm* — Lowe Graham Jones PLLC

(57) ABSTRACT

Microelectromechanical system (MEMS) devices and methods with controlled die bonding areas. An example device includes a MEMS die having a glass layer and a protective package. The glass layer includes a side facing the protective package with at least one mesa protruding from a recessed portion of the glass layer. The at least one mesa is attached to the protective package. An example method includes creating at least one mesa on a glass layer of a MEMS die and attaching the at least one mesa to a protective package.

18 Claims, 4 Drawing Sheets

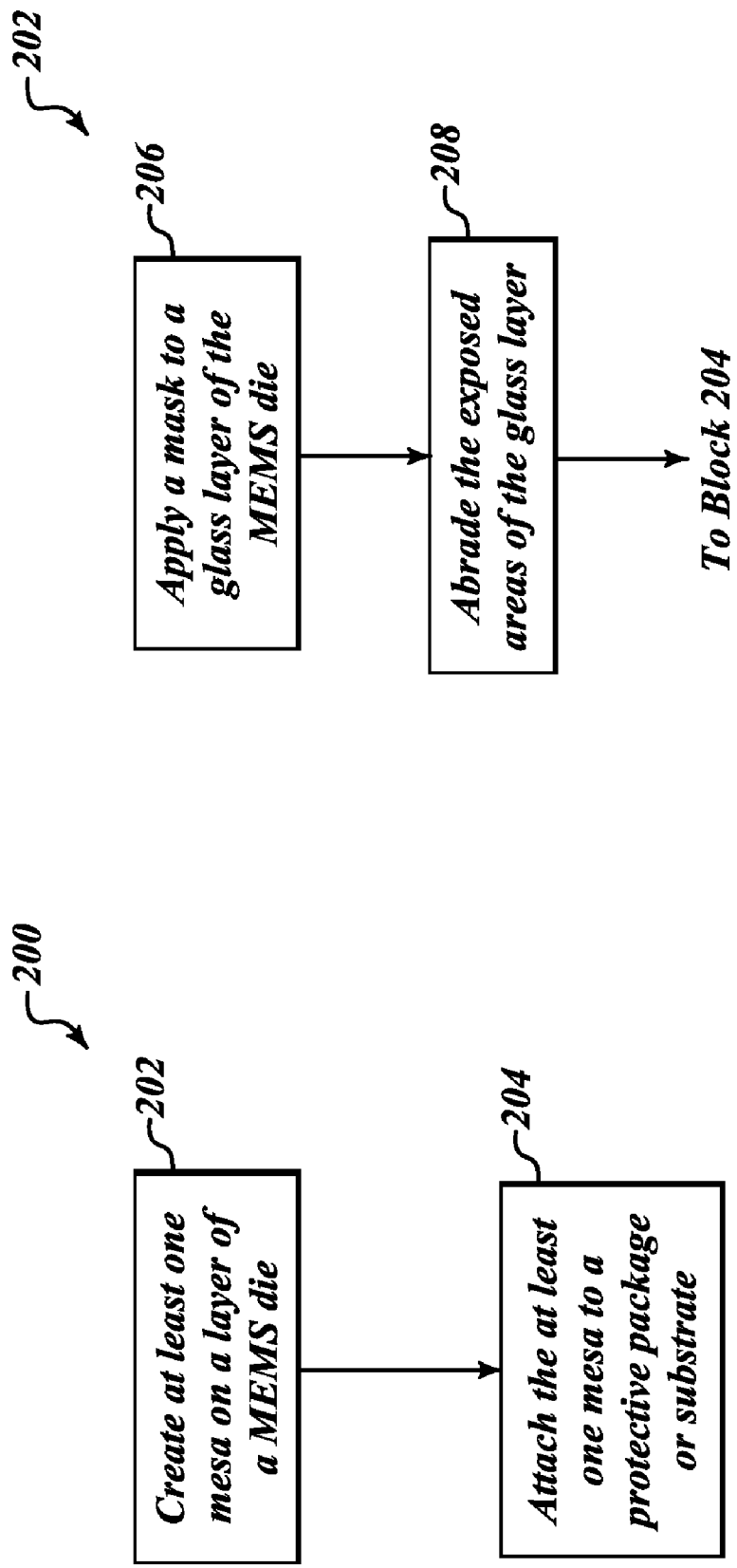

MEMS DEVICES AND METHODS WITH CONTROLLED DIE BONDING AREAS

BACKGROUND OF THE INVENTION

Inertial microelectromechanical system (MEMS) sensors are sensitive to stresses from mounting the sensor in a protective package. A major source of die mounting stress is a mismatch in the speed at which the die and its package expand with temperature changes related to their coefficient of thermal expansion (CTE). Current methods of reducing stress such as using a single attachment point in the center of the die have weaknesses such as not providing enough strength and stability. Additionally, controlling an area where an attachment material such as solder is in contact with the die and package can be difficult and has other drawbacks.

SUMMARY OF THE INVENTION

The present invention includes microelectromechanical system (MEMS) devices and methods with controlled die bonding areas. An example device includes a MEMS die having a glass layer and a protective package. The glass layer includes a side facing the protective package with at least one mesa protruding from a recessed portion of the glass layer. The at least one mesa is attached to the protective package.

In accordance with further aspects of the invention, the glass layer includes a plurality of mesas.

In accordance with other aspects of the invention, the device further includes an attachment material between the at least one mesa and the protective package.

In accordance with still further aspects of the invention, an example method includes creating at least one mesa on a glass layer of a MEMS die and attaching the at least one mesa to a protective package.

In accordance with yet other aspects of the invention, the method includes creating a plurality of mesas.

In accordance with still another aspect of the invention, creating at least one mesa includes abrading a glass layer.

BRIEF DESCRIPTION OF THE DRAWINGS

Preferred and alternative embodiments of the present invention are described in detail below with reference to the following drawings:

FIGS. 4 and 5 are flowcharts of a method of reducing thermal stress in a packaged MEMS device in accordance with an embodiment of the invention.

DETAILED DESCRIPTION OF THE INVENTION

Figure 1:
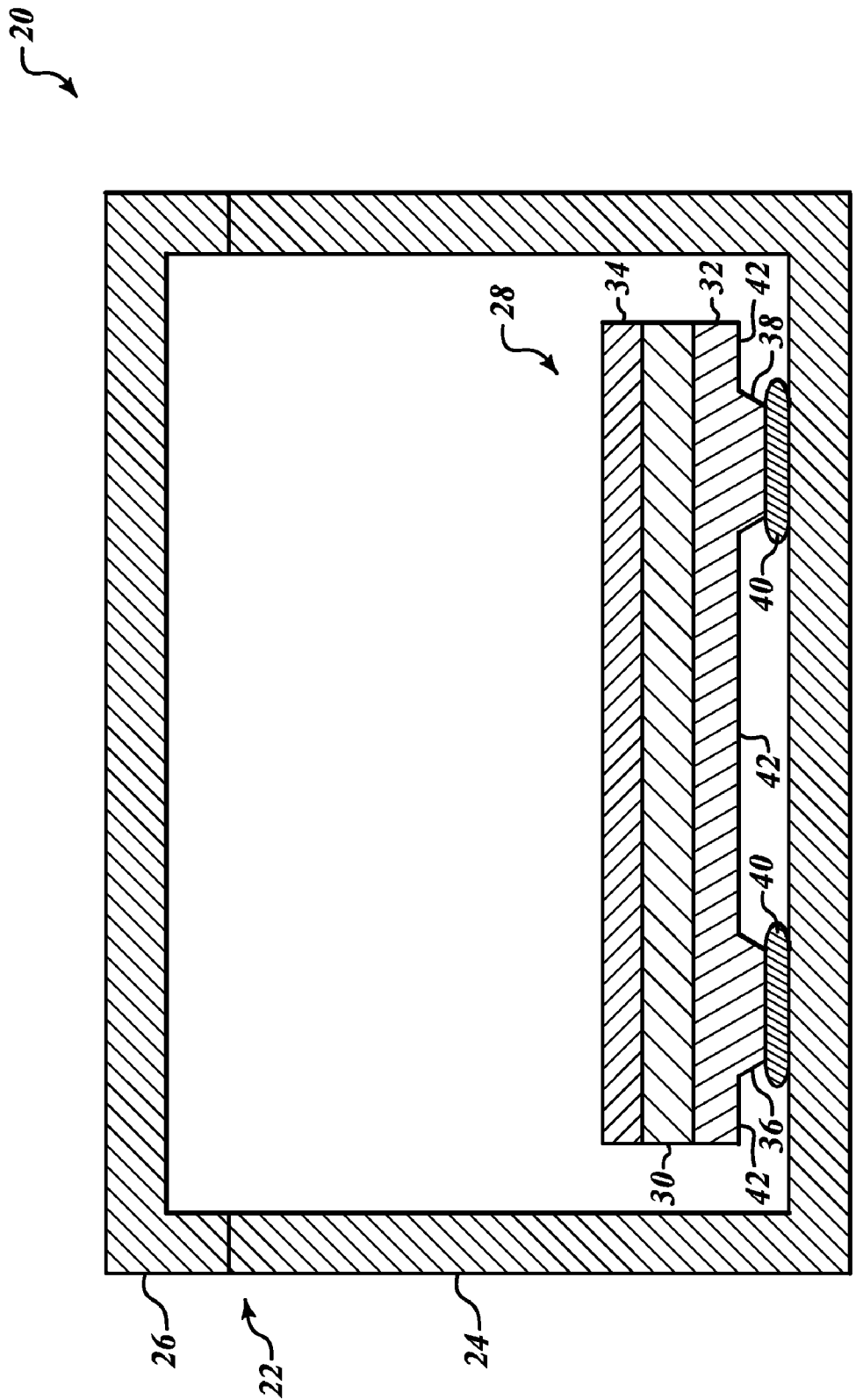
FIG. 1 is a diagram showing a cross-sectional side view of a packaged MEMS device formed in accordance with an embodiment of the invention.

FIG. 1 is a diagram showing a cross-sectional side view of a packaged MEMS device 20 formed in accordance with an embodiment of the invention. The packaged MEMS device 20 includes a protective package 22 having a first package component 24 and a second package component 26. A MEMS device die 28 having a device layer 30, a first glass layer 32, and a second glass layer 34 is attached to the first package component 24. The device layer 30 may be formed of silicon and the first and second glass layers 32, 34 may be formed of a borosilicate glass such as Pyrex®, for example. In other embodiments, differing numbers of layers and/or different layer materials may be used. The MEMS device die 28 includes an inertial sensor such as an accelerometer or a gyroscope in an example embodiment, but may include other types of MEMS devices in other embodiments.

The first glass layer 32 includes a first mesa 36 and a second mesa 38. The mesas 36, 38 are typically between 20 micrometers (μm) and 200 μm in height, but may have a different height in some embodiments. The mesas 36, 38 are attached to the first package component 24 with an attachment material 40. In an example embodiment, the attachment material 40 is a gold-tin solder. However, in other embodiments, other types of solder or other types of materials such as glass frit or epoxy may be used. A recessed portion 42 of the first glass layer 32 is not attached to the protective package 22. It should be understood that FIG. 1 is not drawn to scale and that various components may have different relative sizes in some embodiments. The protective package 22 may be smaller than shown in relation to the MEMS die 28 and/or the attachment material 40 may be thinner in relation to the first glass layer 32 than shown, for example.

Figure 2:
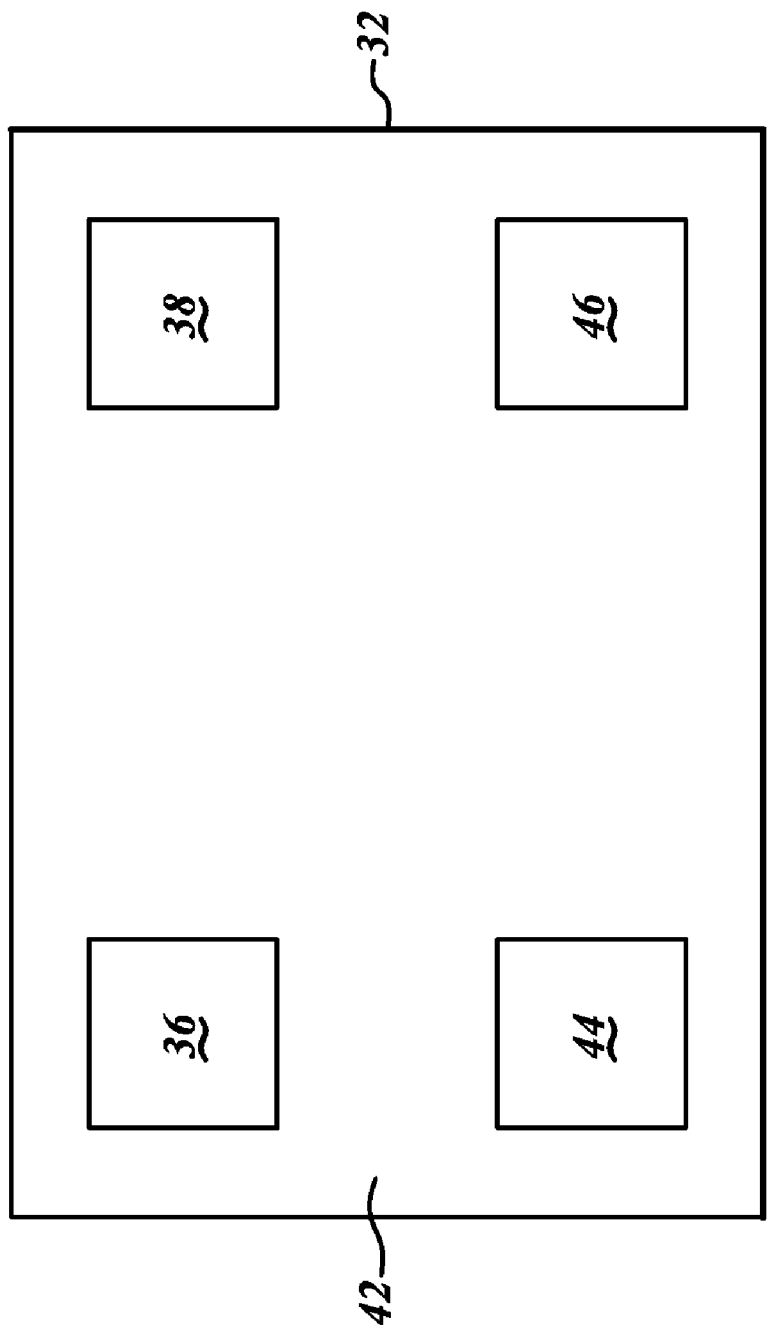
FIG. 2 is a diagram showing a bottom view of a MEMS die having mesas formed in accordance with an embodiment of the invention.

FIG. 2 is a diagram showing a bottom view of the MEMS device die 28 shown in FIG. 1. In addition to the first and second mesas 36, 38, a third mesa 44 and a fourth mesa 46 are also on the first glass layer 32. Although the mesas 36, 38, 44, 46 are shown as having a square profile when viewed from the bottom, the mesas 36, 38, 44, and/or 46 may have almost any shape such as rectangular, round, toroidal, or semi-circular for example. The mesas 36, 38, 44, 46 are typically between approximately 50 and 500 μm across, but may have dimensions outside this range in other embodiments. The mesas 36, 38, 44, 46 are used as bond areas for attachment to the protective package 22. The recessed portion 42 exists in areas of the first glass layer 32 that do not have mesas. The recessed portion 42 is an area that is not desired to be in contact with the protective package 22. In an example embodiment, the recessed portion 42 has an abraded surface. Although only a single die is shown, it should be understood that a plurality of dies will typically be formed at a wafer level followed by dicing the wafer to separate each individual die.

Figure 3:
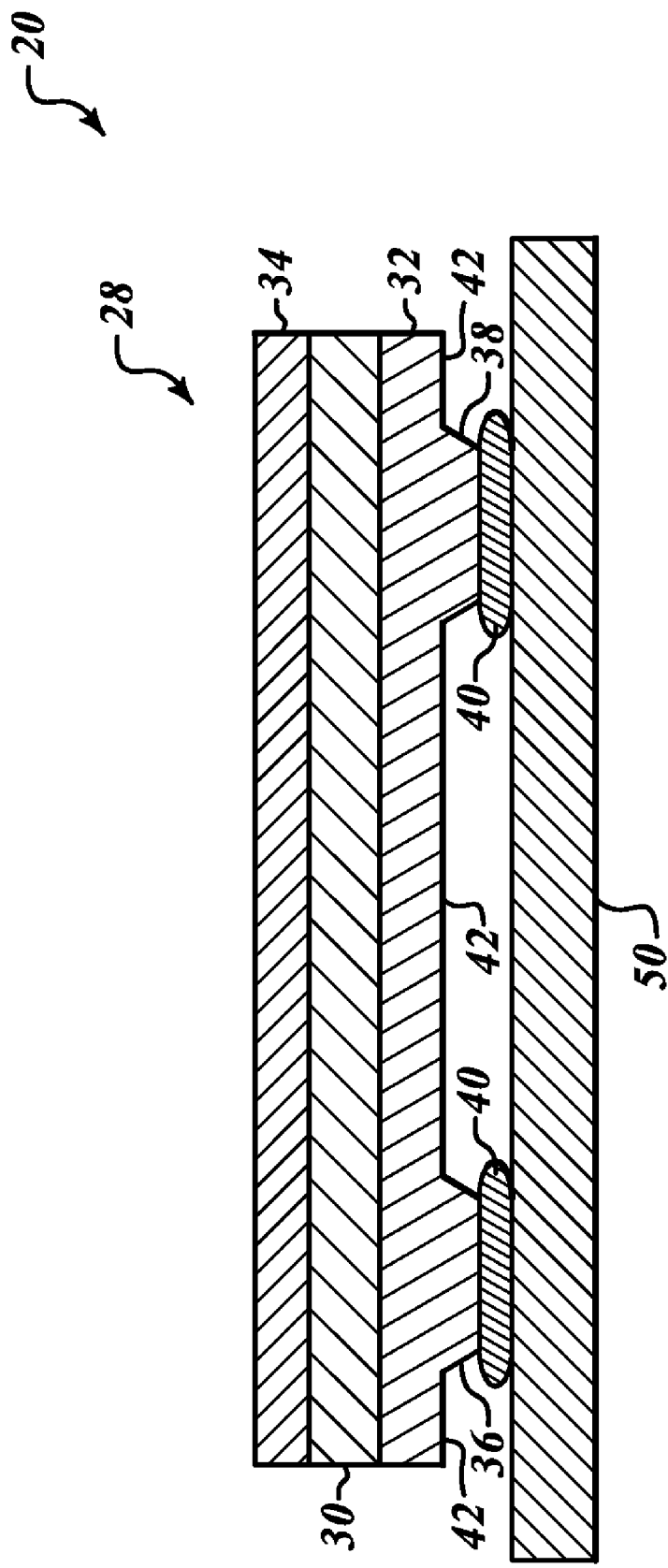
FIG. 3 is a diagram showing a cross-sectional side view of a MEMS device formed in accordance with an embodiment of the invention.

FIG. 3 is a diagram showing a cross-sectional side view of the MEMS device die 28 attached to a substrate 50. In some embodiments, the device die 28 may use a simple die carrier without sidewalls and lid or just be attached directly to a next level of a system, such as a board or intermediate substrate. In some embodiments, the device die 28 is sealed at the die level and does not need a package lid such as the second package component 26 shown in FIG. 1. The device die 28 may then be mounted directly to a system board or to a chip carrier or other intermediate substrate which relieves strain and redistributes signals. Signals in and out of the MEMS device die 28 can go through metal on the mesas 36, 38 or through wire bonds to pads on a package, such as may be used with "flip chip" mounting, for example.

FIGS. 4 and 5 are flowcharts of a method 200 of reducing thermal stress in a packaged MEMS device in accordance with an embodiment of the invention. First, at a block 202, at least one mesa is created on a layer of a MEMS die. The first mesa 36 may be created on the first glass layer 32 of the MEMS device die 28, for example. Next, at a block 204, the at least one mesa is attached to a protective package or substrate. The first mesa 36 may be attached to the protective package 22 or the substrate 50, for example.

As shown in FIG. 5 creating at least one mesa at the block 202 may include abrading a glass layer of the MEMS die by applying a mask to the glass layer at the block 206. The mask is generally formed of a metallic or very tough polymer material. Next, at a block 208, exposed areas of the glass layer are abraded by accelerating an abrasive such as a ceramic material toward the glass layer using a gas. In an example embodiment, the gas is air. However, in other embodiments, other gases or a liquid may be used. Although other techniques may be used to form the mesas in some embodiments, abrasion is preferred with a glass layer because glass is generally resistant to chemical etching and is difficult to laser cut. Then, the mask is removed. Generally, metal masks are held by tooling or temporary adhesives and masks made of polymers are held by adhesives. Depending on the adhesive used, the mask is peeled off or the mask and/or adhesive layer is dissolved using a solvent. Although the method 200 is described with respect to a single MEMS device die, it should be understood that the mesas will typically be created on a plurality of MEMS device dies on a wafer, with the wafer being diced after the mesas have been created. In some embodiments, mesas may be created on a glass layer before the glass layer is attached to a device layer. In other embodiments, the mesas may be created after the glass layer has been attached to the device layer.

While the preferred embodiment of the invention has been illustrated and described, as noted above, many changes can be made without departing from the spirit and scope of the invention. For example, mesas having a different shape may be formed, and/or mesas may be formed in a material other than glass. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A microelectromechanical (MEMS) device comprising:
   a MEMS die having a glass layer; and
   a protective package,
   wherein the glass layer includes a side facing the protective package, the side including at least one mesa protruding from a recessed portion of the glass layer,
   wherein the at least one mesa is attached to the protective package, and
   wherein the MEMS die comprises a sensor.

2. The device of claim 1, wherein the glass layer includes a plurality of mesas.

3. The device of claim 2, wherein the recessed portion has an abraded surface.

4. The device of claim 3, further comprising an attachment material between the at least one mesa and the protective package.

5. The device of claim 4, wherein the attachment material comprises solder.

6. The device of claim 4, wherein the attachment material comprises glass frit.

7. The device of claim 4, wherein the attachment material comprises epoxy.

8. The device of claim 1, wherein the die includes a MEMS accelerometer.

9. The device of claim 1, wherein the die includes a MEMS gyroscope.

10. The device of claim 1, wherein the recessed portion is not attached to the protective package.

11. A method of reducing thermal stress in a packaged MEMS device, the method comprising:
    creating at least one mesa on a layer of glass bonded to a MEMS die; and
    attaching the at least one mesa to a protective package,
    wherein the MEMS die comprises a sensor.

12. The method of claim 11, wherein creating at least one mesa includes creating a plurality of mesas.

13. The method of claim 11, wherein creating at least one mesa includes abrading a glass layer.

14. The method of claim 13, wherein abrading comprises:
    applying a mask to the glass layer; and
    abrading exposed areas of the glass layer by accelerating an abrasive toward the glass layer using a gas.

15. The method of claim 14, wherein the gas is air.

16. The method of claim 11, wherein attaching is performed with a solder.

17. The method of claim 11, wherein attaching is performed with glass frit.

18. The method of claim 11, wherein attaching is performed with epoxy.

* * * * *